United States Patent
Pan

(10) Patent No.: US 11,086,168 B2
(45) Date of Patent: Aug. 10, 2021

(54) DISPLAY PANEL

(71) Applicant: Himax Display, Inc., Tainan (TW)

(72) Inventor: Po-Hung Pan, Tainan (TW)

(73) Assignee: Himax Display, Inc., Tainan (TW)

( * ) Notice: Subject to any disclaimer, the term of this patent is extended or adjusted under 35 U.S.C. 154(b) by 0 days.

(21) Appl. No.: 16/709,945

(22) Filed: Dec. 11, 2019

(65) Prior Publication Data

US 2021/0181552 A1    Jun. 17, 2021

(51) Int. Cl.
| G02F 1/1339 | (2006.01) |
| G02F 1/1333 | (2006.01) |
| G02F 1/1337 | (2006.01) |
| H01L 27/32 | (2006.01) |

(52) U.S. Cl.
CPC .......... *G02F 1/1339* (2013.01); *G02F 1/1337* (2013.01); *G02F 1/133345* (2013.01); *H01L 27/32* (2013.01)

(58) Field of Classification Search
CPC .......... G02F 1/13394; G02F 1/133784; G02F 1/1337; G02F 1/1339; G02F 1/133345; G02F 1/13454; H01L 27/32
USPC .................................................. 349/153–154
See application file for complete search history.

(56) References Cited

U.S. PATENT DOCUMENTS

| 5,953,094 A * | 9/1999 | Matsuoka | G02F 1/1339 |
| | | | 349/153 |
| 2010/0079718 A1* | 4/2010 | Sekiya | G02F 1/133512 |
| | | | 349/153 |
| 2012/0242946 A1* | 9/2012 | Itoh | G02F 1/1339 |
| | | | 349/153 |
| 2015/0029432 A1* | 1/2015 | Ishikawa | G02F 1/13394 |
| | | | 349/43 |
| 2016/0161778 A1* | 6/2016 | Nishino | G02F 1/1339 |
| | | | 349/42 |
| 2018/0217423 A1* | 8/2018 | Suzuki | G02F 1/13394 |
| 2018/0314097 A1* | 11/2018 | Kiyota | G02F 1/1339 |

FOREIGN PATENT DOCUMENTS

| TW | I329217 | 8/2010 |
| TW | 201205154 | 2/2012 |
| TW | I494668 | 8/2015 |
| TW | I551927 | 10/2016 |

OTHER PUBLICATIONS

"Office Action of Taiwan Counterpart Application", dated Jan. 12, 2021, p. 1-p. 6.

* cited by examiner

*Primary Examiner* — Charles S Chang
(74) *Attorney, Agent, or Firm* — JCIPRNET

(57) ABSTRACT

A display panel includes a first substrate, a second substrate, a display medium layer, and a sealant. The display medium layer may be disposed between the top substrate and the bottom substrate. The sealant may be disposed between the first substrate and the second substrate and surround the display medium layer. At least one of the first substrate and the second substrate includes a support plate and an alignment layer. The alignment layer may be disposed on the support plate between the support plate and the display medium layer. A perimeter of the alignment layer may be completely encapsulated by the sealant. The at least one of the first substrate and the second substrate may have a plurality of microstructures positioned between the perimeter of the alignment layer and an edge of the support plate.

17 Claims, 9 Drawing Sheets

DISPLAY PANEL

BACKGROUND

Technical Field

The present invention generally relates to an electronic device, in particular, to a display panel.

Description of Related Art

The development of electronic devices keeps flourish. Display technique is one of the notable topics in the modern electronic devices and products. A display panel may commonly include two substrates, a display medium layer sandwiched between the two substrates and a sealant sealing the display medium layer between the two substrates. On the two substrates, a plurality of film layer may be formed to achieve required functions such as driving, alignment, protection and the like. However, the display panel may face different issues when applied in various applications.

SUMMARY

Accordingly, the present invention is directed to a display panel having improved quality and reliability.

According to an embodiment, a display panel includes a first substrate, a second substrate, a display medium layer, and a sealant. The display medium layer may be disposed between the top substrate and the bottom substrate. The sealant may be disposed between the first substrate and the second substrate and surround the display medium layer. At least one of the first substrate and the second substrate includes a support plate and an alignment layer. The alignment layer may be disposed on the support plate between the support plate and the display medium layer. A perimeter of the alignment layer may be completely encapsulated by the sealant. The at least one of the first substrate and the second substrate may have a plurality of microstructures positioned between the perimeter of the alignment layer and an edge of the support plate.

According to the embodiments of the disclosure, the sealant is in contact with at least a portion of the microstructures.

According to the embodiments of the disclosure, the sealant is in contact with a portion of a top surface of the alignment layer.

According to the embodiments of the disclosure, the microstructures are arranged along the perimeter of the alignment layer.

According to the embodiments of the disclosure, the at least one of the first substrate and the second substrate further includes an underlying layer disposed between the support plate and the alignment layer.

According to the embodiments of the disclosure, the microstructures include protrusions and concaves between the protrusions, and at least a portion of the respective protrusions is formed in the underlying layer.

According to the embodiments of the disclosure, a thickness of the underlying layer at the concaves is thinner than a thickness of the underlying layer at the protrusions.

According to the embodiments of the disclosure, the concaves penetrate through the underlying layer.

According to the embodiments of the disclosure, each of the protrusions comprises a first portion and a second portion, and the first portion is disposed on top of the second portion.

According to the embodiments of the disclosure, a material of the first portion is identical to the alignment layer or the underlying layer, and a material of the second portion is identical to the underlying layer or the support plate.

According to the embodiments of the disclosure, a thickness of a portion of the underlying layer covered by the alignment layer is substantially the same as a thickness of the underlying layer at the protrusions.

According to the embodiments of the disclosure, a thickness of a portion of the underlying layer covered by the alignment layer is smaller than the thickness of the underlying layer at the protrusions.

According to the embodiments of the disclosure, the underlying layer is a conductive layer.

According to the embodiments of the disclosure, the underlying layer is continuous between the microstructures.

According to the embodiments of the disclosure, the underlying layer is an insulation layer.

According to the embodiments of the disclosure, the at least one of the first substrate and the second substrate further comprises a driving layer disposed on the support plate between the underlying layer and the support plate.

According to the embodiments of the disclosure, the support plate is a wafer plate.

According to the embodiments of the disclosure, an entirety of the alignment layer is disposed on the underlying layer.

According to the embodiments of the disclosure, the at least one of the first substrate and the second substrate further includes an outer periphery layer disposed on the support plate, the underlying layer is disposed between the support plate and the outer periphery layer, and the microstructures are located between the perimeter of the alignment layer and the outer periphery layer.

In light of the foregoing, the display panel according to some embodiments of the disclosure may include a substrate having the alignment layer completely sealed by the sealant and microstructures positioned between the perimeter of the alignment layer and the edge of the substrate. The water vapor transmission through the alignment layer may be prevented. In some embodiments, the sealant of the display panel may be in contact with at least a portion of the microstructures so that the peeling of the sealant may be prevented. Accordingly, the display panel in accordance with the embodiments of the disclosure may have improved life time and reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
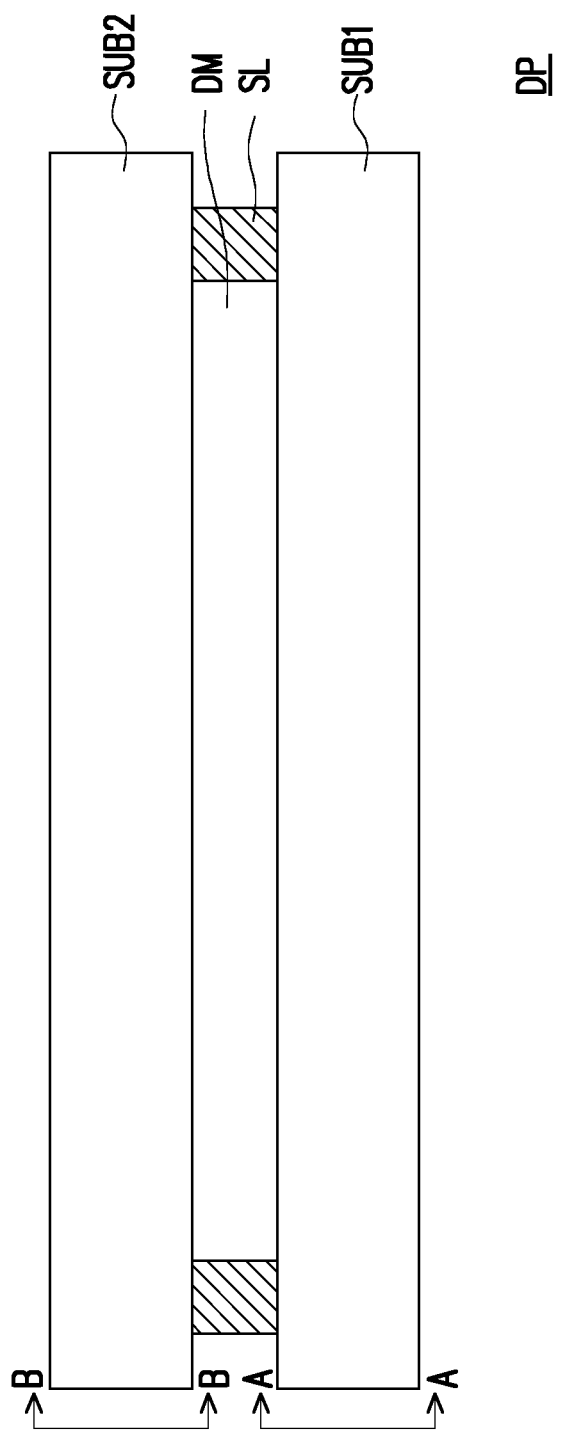
FIG. 1 schematically illustrates a cross sectional view of a display panel in accordance with an embodiment of the disclosure.

FIG. 1 schematically illustrates a cross sectional view of a display panel in accordance with an embodiment of the disclosure. Referring to FIG. 1, a display panel DP may include a first substrate SUB1, a second substrate SUB2, a display medium layer DM, and a sealant SL. In the embodiment, the first substrate SUB1 and the second substrate SUB2 are stacked in a top and bottom manner and the shape of the first substrate SUB1 and the second substrate SUB2 viewed in the thickness direction may be substantially the same, but in some alternative embodiments, one of the first substrate SUB1 and the second substrate SUB2 may be larger than the other. The display medium layer DM and the sealant SL may be disposed between the first substrate SUB1 and the second substrate SUB2. The sealant SL may surround the display medium layer DM to seal the display medium layer DM between the first substrate SUB1 and the second substrate SUB2. A material of the display medium layer DM may include a liquid crystal material so that the first substrate SUB1, the second substrate SUB2, the display medium layer DM and the sealant SL may serve as a liquid crystal cell. In alternative embodiments, the material of the display medium layer DM may include an organic light emitting material, an electro-wetting display medium material, an electrophoresis display medium material or other material capable of achieving the image displaying function. A material of the sealant SL may include a curable material, such as a light or thermally curable material. In some embodiments, the material of the sealant SL may include curable resin, curable polymer or the like. In FIG. 1, the first substrate SUB1 and the second substrate SUB2 are represented by a rectangle for simplifying the drawing, but each of the first substrate SUB1 and the second substrate SUB2 may include a support plate and a plurality of film layers which will be described below. The film layers may be disposed on a surface of the support plate facing the display medium layer DM and/or facing away from the display medium layer DM.

Figure 2:
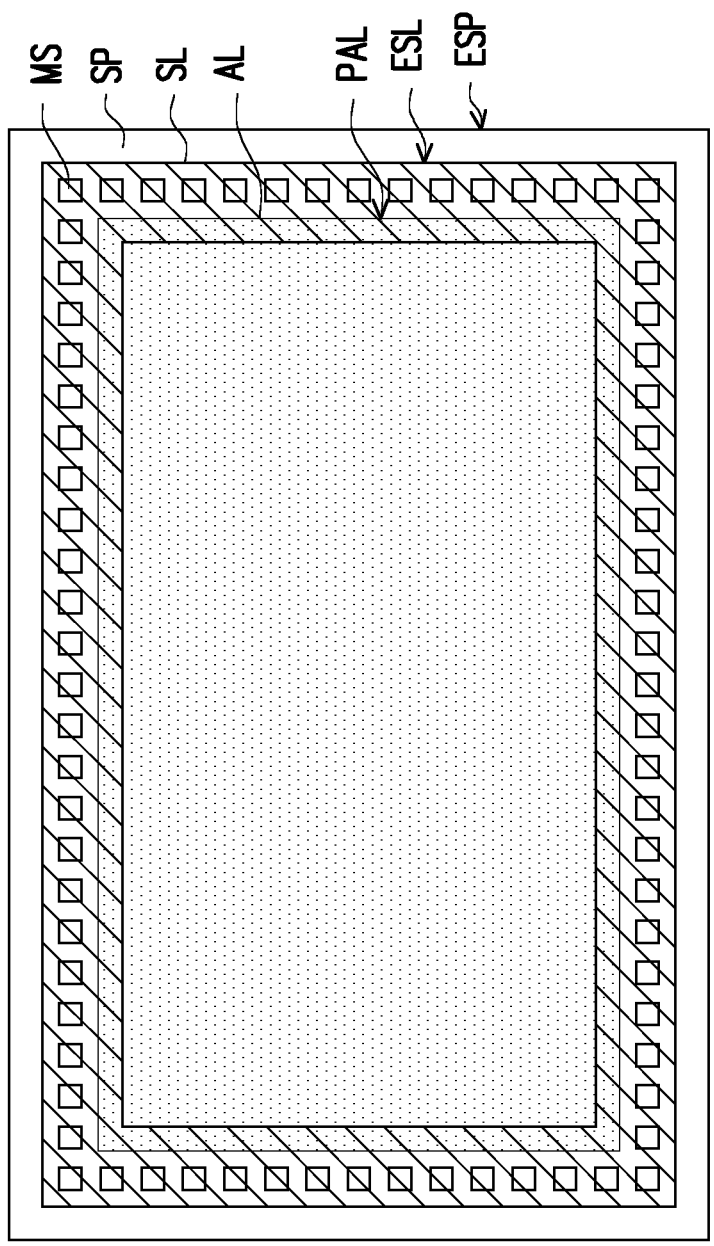
FIG. 2 schematically illustrates an exemplary top view of a portion of the components in a display panel depicted in FIG. 1.

FIG. 2 schematically illustrates an exemplary top view of some components in a display panel depicted in FIG. 1. Referring to FIG. 1 and FIG. 2, in the display panel DP, at least one of the first substrate SUB1 and the second substrate SUB2 may have a plurality of microstructures MS and include a support plate SP, and an alignment layer AL. The support plate SP may be a glass plate, a polymer plate, a crystalline plate, a silicon backplane or the like. The support plate SP may provide a substantially planar surface for forming film layers disposed thereon and have sufficient rigidity and/or mechanical characteristics to support the display medium layer DM. The alignment layer AL may be disposed on the support plate SP between the support plate SP and the display medium layer DM. In other words, the alignment layer AL may be disposed on a surface of at least one of the first substrate SUB1 and the second substrate SUB2 facing the display medium layer DM. In some embodiments, the alignment layer AL may be in contact with the display medium layer DM. The microstructures MS may be positioned between the perimeter PAL of the alignment layer AL and an edge ESP of the support plate SP. The microstructures MS may be arranged along the perimeter PAL of the alignment layer AL. The shape of the microstructure MS may be rectangle, triangle, trapezoid, circle, oval, polygon, or irregular shapes. The microstructure MS may be arranged in rows and columns with regular pitch or irregular pitch. An area of each of the microstructures MS measured in the top view may range from 1 $nm^2$ to 10 $mm^2$. In addition, the sealant SL may overlap the microstructures MS and also overlap a portion of the alignment layer AL. The sealant SL completely encapsulates the perimeter PAL of the alignment layer AL. In some embodiments, a portion of the microstructures MS may be positioned between the outer edge ESL of the sealant SL and the edge ESP of the support plate SP. The perimeter PAL of the alignment layer AL may be completely covered and sealed by the sealant SL, such that external vapor transmitting to the display medium layer DM through the alignment layer AL would be reduced. Accordingly, the display medium layer DM would less likely be deteriorated due to the penetration of external vapor such that the display panel DP may have better reliability and lifetime.

Figure 3:
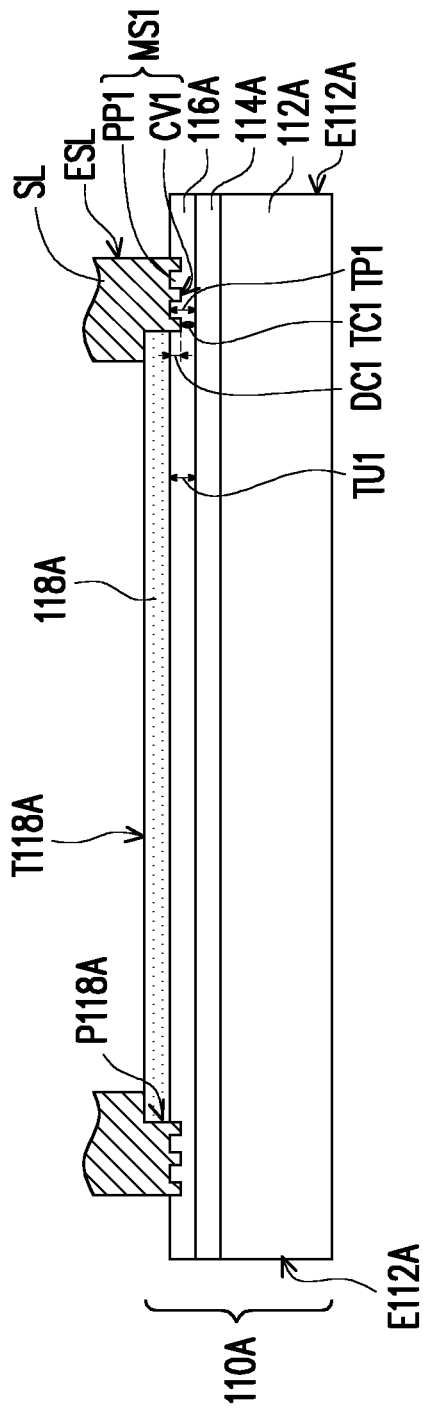
FIG. 3 to FIG. 8 schematically illustrates a cross section of a portion A-A of a display panel according to some embodiments of the disclosure.

FIG. 3 schematically illustrates a cross section of a portion A-A of a display panel according to some embodiments of the disclosure and FIG. 3 only shows the first substrate and the sealant for simplifying the drawings. In FIG. 3, the first substrate 110A may be applicable in the display panel DP and serve as an exemplary example for accomplishing the first substrate SUB1 in FIG. 1. In the embodiment, the first substrate 110A may serve as a driving substrate capable of providing the electric field to drive the display medium layer DM (shown in FIG. 1) to achieve the display function. The first substrate 110A may include a support plate 112A, a driving layer 114A, an underlying layer 116A and an alignment layer 118A. The support plate 112A may include a glass plate, a polymer plate, a wafer plate, or the like. The driving layer 114A, the underlying layer 116A and the alignment layer 118A may be sequentially disposed on the support plate 112A. The driving layer 114A may be a transistor array such as a thin film transistor array or a CMOS (Complementary Metal-Oxide Semiconductor) device array (not shown). In some embodiments, the support plate 112A may be silicon wafer such that the display panel having the first substrate 110A may be a Liquid Crystal On Silicon (LCoS) panel.

The driving layer 114A may include active devices, signal transmission lines, capacitors, and/or the like that together construct the required circuit structure for providing the electric field driving the display medium layer DM (shown in FIG. 1). The driving layer 114A may include a plurality of patterned and/or non-patterned conductive film layers and a plurality of patterned and/or non-patterned insulating film layers to define the active devices, the signal transmission lines, the capacitors or the like.

The underlying layer 116A is disposed on the support plate 112A and covers the driving layer 114A. The underlying layer 116A is an insulation layer and serves as a protection layer of the driving layer 114A. A material of the underlying layer 116A may include insulation material such as silicon oxide, silicon nitride, silicon oxynitride, or the like. The underlying layer 116A and the alignment layer 118A may be sequentially formed on the support plate 112A and an entirety of the alignment layer 118A is disposed on the underlying layer 116A. The underlying layer 116A may be disposed between the alignment layer 118A and the support plate 112A and in contact with the alignment layer 118A. The underlying layer 116A may be a layer under the alignment layer 118A. The so-called "under" may be determined based on the relative position of a layer with respect to the support plate 112A. Specifically, in the case that one layer is located more adjacent to the support plate 112A than and formed prior to another layer, the one layer may be considered as being disposed under another layer.

The alignment layer 118A may be disposed on the support plate 112A facing the display medium layer DM (shown in FIG. 1). The alignment layer 118A may be in contact with the display medium layer DM (shown in FIG. 1) and partially covered by the sealant SL. The sealant SL may be in contact with a portion of a top surface T118A of the alignment layer 118A. In some embodiments, the material of the alignment layer 118A may include polymer such as polyimide or the like. The top surface T118A of the alignment layer 118A in contact with the display medium layer DM may have alignment structures by rubbing so as to align the orientation of the molecules of the display medium layer DM.

The first substrate 110A may have microstructures MS1 including protrusions PP1 and concaves CV1 between the protrusions PP1. The first substrate 110A may have a surface roughness at the region of the microstructures MS1 greater than at the region of the alignment layer 118A. For example, the surface roughness of the first substrate 110A at the region of the microstructures MS1 may be greater than 1 nm. The protrusions PP1 and the concaves CV1 may be formed in the underlying layer 116A, for example. The protrusions PP1 and the concaves CV1 are positioned between the perimeter P118A of the alignment layer 118A and the edge E112A of the support plate 112A. The concaves CV1 and the protrusions PP1 may be alternately arranged. In some embodiments, the arrangement, the shape, the size and the like of the concaves CV1 and the protrusions PP1 in top view may be similar to those of the microstructures MS2 in FIG. 2.

The protrusions PP1 may be defined by a portion of the underlying layer 116A. The underlying layer 116A may have a thickness TP1 at the protrusions PP1 and a thickness TC1 at the concaves CV1, and the thickness TP1 may be greater than the thickness TC1. The concaves CV1 may have a depth DC1 and the sum of the depth DC1 and the thickness TC1 may be substantially equal to the thickness TP1, but not limited thereto. The depth DC1 may a variance between the thickness TP1 and the thickness TC1 and may be ranged from 1 nm to 100 µm. As such the surface roughness of the first substrate 110A at the region of the microstructures MS1 may be greater than 1 nm. The underlying layer 116A may have a thickness TU1 at the portion in contact with and may be covered by the alignment layer 118A. In some embodiments, the thickness TP1 may be similar to or identical to the thickness TU1 and the thickness TC1 may be smaller than the thickness TU1, but not limited thereto. The concaves CV1 may not be covered by the material of the alignment layer 118A.

The microstructures MS1 may be formed by the patterning process for forming the alignment layer 118A. For example, the material layer for the underlying layer 116A and the material layer for the alignment layer 118A may be formed on the support plate 112A in sequence. The method of forming the material layer for the underlying layer 116A and the material layer for the alignment layer 118A may include deposition, coating, printing or the like. For example, the method of forming the material layer for the alignment layer 118A may be spin coating. In some embodiments, the alignment layer 118A formed by using spin coating may have a flattened top surface facing away from the support plate 112A. In the case that an alignment layer is formed by using a printing process such as APR printing, the printed alignment layer may have a non-uniformed top surface. For example, the thickness of the printed alignment layer at the edge portion may be thicker than at the central portion, which forms a horn-like surface structure at the edge portion. Comparably, the thickness of the spin coating formed material layer for the alignment layer 118A may be so even that the level variation or the surface roughness of the top surface T118A of the alignment layer 118A may be smaller than 1 nm.

A patterning process may then be performed to define the perimeter P118A of the alignment layer 118A. The patterning process may include a laser process by irradiating laser pulses on the material layer for the alignment layer 118A along a predetermined path so that the material layer of the alignment layer 118A may be patterned to form the alignment layer 118A with the required perimeter P118A that surrounds a closed area. The laser pulses may have sufficient energy to remove the material of the alignment layer 118A to define the perimeter P118A of the alignment layer 118A. In some embodiments, the laser pulses may further remove a portion of the underlying layer 116A so that the concaves CV1 may be formed in the underlying layer 116A while other portions of the underlying layer 116A may not be removed by the laser pulses and define the protrusions PP1 between the concaves CV1. The concaves CV1 in the underlying layer 116A may be arranged along the perimeter P118A of the alignment layer 118A according to the path of the laser pulses. In some embodiments, some of the material layer of the alignment layer 118A may remain on the protrusions PP1 without in contact with the alignment layer 118A.

Subsequent to the formation of the alignment layer 118A and the microstructures MS1, the sealant SL may be formed on the first substrate 110A to assemble the first substrate 110A with the second substrate, e.g. the second substrate SUB2 shown in FIG. 1. The perimeter P118A of the alignment layer 118A may be completely covered and encapsulated by the sealant SL. The sealant SL may overlap with a portion of the alignment layer 118A and exceed the perimeter P118A of the alignment layer 118A to cover a portion of the underlying layer 116A. The material of the alignment layer 118A may have a water vapor transmittance greater than the material of the sealant SL, such that external vapor transmitting to the display medium layer DM (shown in FIG. 1) through the alignment layer 118A would be reduced by the sealant SL encapsulating the perimeter P118A of the alignment layer 118A. The sealant SL may cover at least a portion of the microstructures MS1 including the concaves CV1 and the protrusions PP1. The sealant SL may extend in the concaves CV1, and be in contact with at least a portion of the protrusions PP1 and at least a portion of the concaves CV1, such that the contact surface of the sealant SL contacting the first substrate 110A may be increased to enhance the connection strength between the sealant SL and the underlying layer 116A. The peeling of the sealant SL may be prevented. The underlying layer 116A may continuously extend from the area where the alignment layer 118A is to the edge E112A of the support plate 112A. In some embodiments, a portion of the underlying layer 116A between the outer edge ESL of the sealant SL and the edge E112A of the support plate 112A may also be patterned to define further microstructures MS1. Accordingly, in some embodiments, the microstructures MS1 may not be covered by the sealant SL, but not limited thereto.

Figure 4:
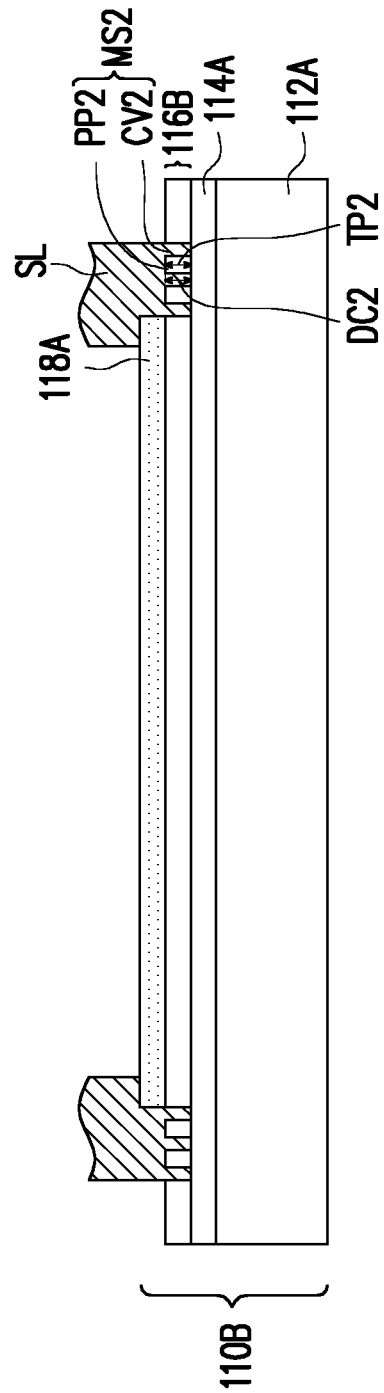

FIG. 4 schematically illustrates a cross section of a portion A-A of a display panel according to some embodiments of the disclosure. In FIG. 4, the first substrate 110B may be applicable in the display panel DP to serve as an exemplary example for accomplishing the first substrate SUB1 in FIG. 1. The first substrate 110B may include a support plate 112A, a driving layer 114A, an underlying layer 116B and an alignment layer 118A. The support plate 112A, the driving layer 114A and the alignment layer 118A may be similar to those described in the above embodiment of FIG. 3 and the details for these components are not reiterated here. The first substrate 110B may have the microstructures MS2 including protrusions PP2 and concaves CV2 between the protrusions PP2 that are formed in the underlying layer 116B. In the embodiment, the material of the underlying layer 116B may be removed at the concaves CV2 and thus the concaves CV2 may penetrate through the underlying layer 116B in thickness. The thickness TP2 of the underlying layer 116B at the protrusions PP2 may be substantially equal to the depth DC2 of the concaves CV2. In some embodiments, the depth DC2 may range from 1 nm to 100 μm, but not limited thereto. A portion of the driving layer 114A may not be covered by the material of the underlying layer 116B at the concaves CV2. The sealant SL may extend in the concaves CV2 and may be in contact with the portion of the driving layer 114A at the concaves CV2. In some embodiments, the underlying layer 116B though is removed at the concaves CV2 still has a continuous top view pattern. In other words, the concaves CV2 would not divide the underlying layer 116B into independent patterns.

Figure 5:
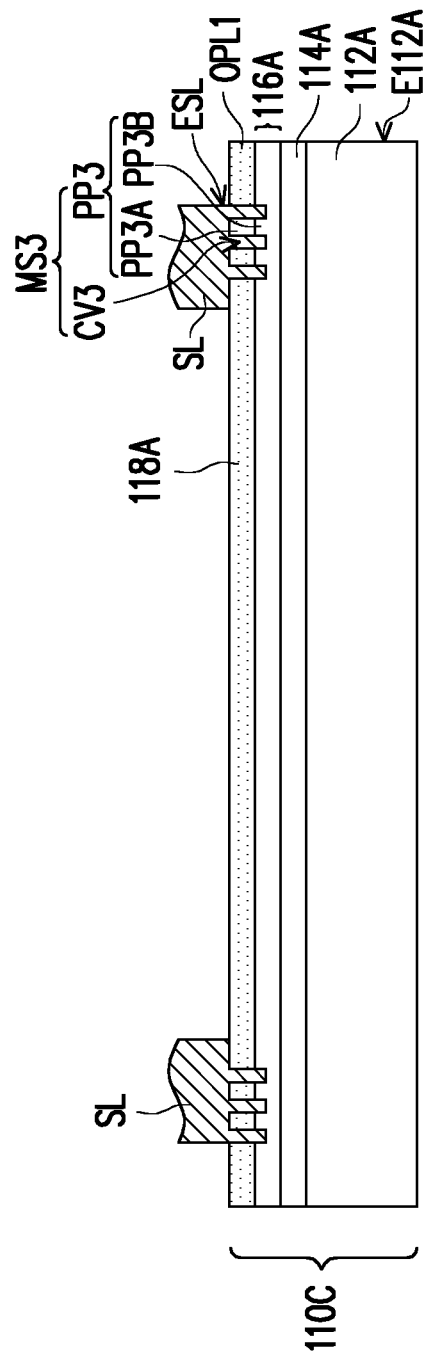

FIG. 5 schematically illustrates a cross section of a portion A-A of a display panel according to some embodiments of the disclosure. In FIG. 5, the first substrate 110C may be applicable in the display panel DP to serve as an exemplary example for accomplishing the first substrate SUB1 in FIG. 1. The first substrate 110C may include a support plate 112A, a driving layer 114A, an underlying layer 116A and an alignment layer 118A. The support plate 112A, the driving layer 114A, the underlying layer 116A and the alignment layer 118A may be similar to those described in the above embodiment of FIG. 3 and the details for these components are not reiterated here. The microstructures MS3 in the first substrate 110C may include protrusions PP3 and concaves CV3, and each of the protrusions PP3 may include a first portion PP3A formed on top of a second portion PP3B. The first portion PP3A may have a material and a thickness the same as the alignment layer 118A, but it is not limited thereto. The depth of the concaves CV3 is greater than the thickness of the first portion PP3A and may be ranged from 1 nm to 100 μm. The first portion PP3A is separated from the alignment layer 118A by at least one concave CV3. In other words, the alignment layer 118A and the first portion PP3A are not in contact with each other. The underlying layer 116A may be patterned so that the underlying layer 116A at the concaves CV3 may have a smaller thickness than the underlying layer 116A at the protrusions PP3. The thicker portion of the underlying layer 116A defines the second portion PP3B of each protrusion PP3. The thinner portion of the underlying layer 116A defines a portion of each concave CV3. The first portion PP3A is disposed on top of the second portion PP3B to define the protrusion PP3. In some embodiments, the dual layer design of the protrusions PP3 may be applicable in the embodiment of FIG. 4, such that the material of the alignment layer 118A may remain on the top of the underlying layer 116B at the protrusions PP2.

In addition, in FIG. 5, the first substrate 110C may further include an outer periphery layer OPL1 disposed on the support plate 112A between the outer edge ESL of the sealant SL and the edge E112A of the support plate 112A. A portion of the underlying layer 116A is disposed between the support plate 112A and the outer periphery layer OPL1 and the microstructures MS3 are located between the perimeter P118A of the alignment layer 118A and the outer periphery layer OPL1. In some embodiments, the outer periphery layer OPL1 and the underlying layer 116A under the outer periphery layer OPL1 may be patterned to define microstructures that are not covered by the sealant SL.

Figure 6:
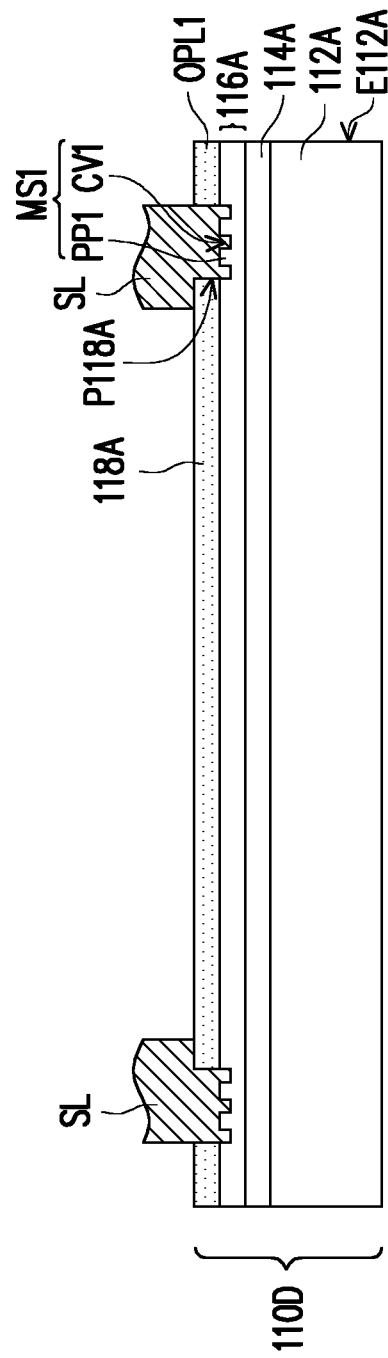

FIG. 6 schematically illustrates a cross section of a portion A-A of a display panel according to some embodiments of the disclosure. In FIG. 6, the first substrate 110D may be applicable in the display panel DP to serve as another exemplary example for accomplishing the first substrate SUB1 in FIG. 1. The first substrate 110D may include a support plate 112A, a driving layer 114A, an underlying layer 116A and an alignment layer 118A. The support plate 112A, the driving layer 114A, the underlying layer 116A and the alignment layer 118A may be similar to those described in the above embodiments and the details for these components are not reiterated here. The first substrate 110D may have the microstructures MS1 formed by the protrusions PP1 and the concaves CV1 in the underlying layer 116A. The first substrate 110D may further include an outer periphery layer OPL1 disposed on the support plate 112A. A portion of the underlying layer 116A is disposed between the support plate 112A and the outer periphery layer OPL1. The microstructures MS1 are located between the perimeter P118A of the alignment layer 118A and the outer periphery layer OPL1 while the sealant SL is in contact with the microstructures MS1 and do not cover a portion of the outer periphery layer OPL1. The outer periphery layer OPL1 may be in contact with the underlying layer 116A and made of a material identical to a material of the alignment layer 118A. In some embodiments, the outer periphery layer OPL1 may be applicable in the embodiment of FIG. 4 and formed between the microstructures MS2 and the edge of the support plate 112A without in contact with the alignment layer 118A shown in FIG. 4.

Figure 7:
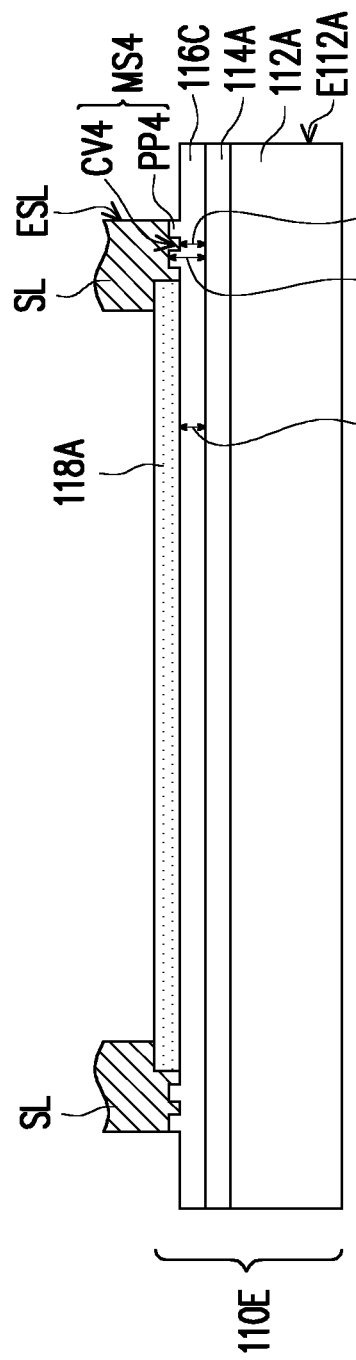

FIG. 7 schematically illustrates a cross section of a portion A-A of a display panel according to some embodiments of the disclosure. In FIG. 7, the first substrate 110E may be applicable in the display panel DP to serve as a further exemplary example for accomplishing the first substrate SUB1 in FIG. 1. The first substrate 110E may include a support plate 112A, a driving layer 114A, an underlying layer 116C and an alignment layer 118A. The underlying layer 116C may have protrusions PP4 and define concaves CV4 between the protrusions PP4 to form the microstructures MS4 in the first substrate 110E. The sealant SL may cover and be in contact with the microstructures MS4. The thickness TP3 of the underlying layer 116C at the protrusions PP4 may be greater than the thickness TC2 of the underlying layer 116C at the concaves CV4. In addition, the thickness TU2 of the underlying layer 116C at the portion of the underlying layer 116C covered by the alignment layer 118A may be similar to or the same as the thickness TC2 of the underlying layer 116C at the concaves CV4. The thickness TP3 of the underlying layer 116C at the protrusions PP4 may be greater than the thickness TU2 of the underlying layer 116C at the portion of the underlying layer 116C covered by the alignment layer 118A. The underlying layer 116C may have a flat surface at the region between the sealant SL and the edge E112A of the support plate 112A, but not limited thereto. In some alternative embodiments, the portion of the underlying layer 116C between the outer edge ESL of the sealant SL and the edge E112A of the support plate 112A may be patterned to form further protrusions (not shown) not covered by the sealant SL. In further alternative embodiments, the dual layer design of the microstructures MS3 and/or the outer periphery layer OPL1 shown in FIG. 5 may be applicable in the first substrate 110E.

Figure 8:
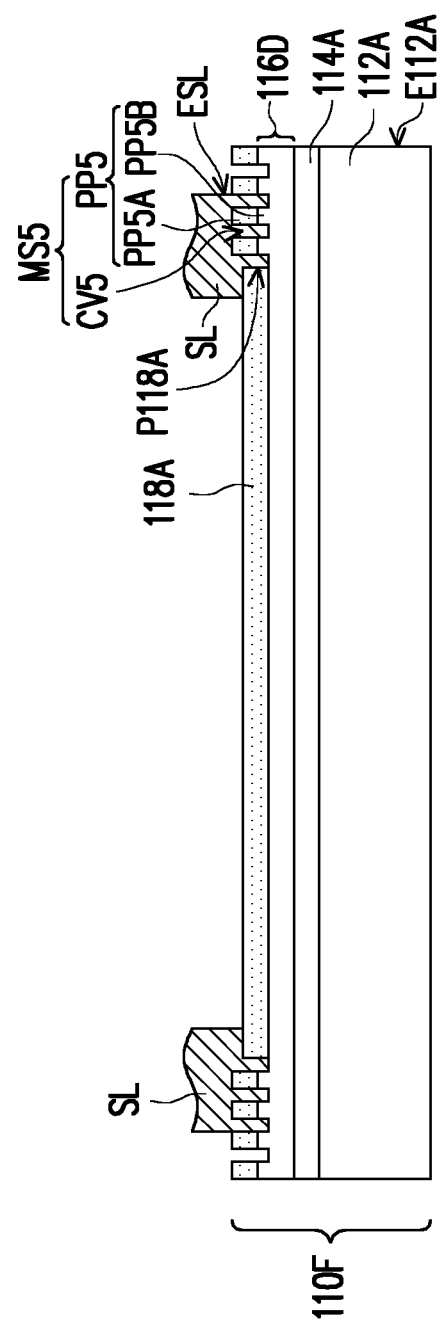

FIG. 8 schematically illustrates a cross section of a portion A-A of a display panel according to some embodiments of the disclosure. In FIG. 8, the first substrate 110F may be applicable in the display panel DP to serve as a further exemplary example for accomplishing the first substrate SUB1 in FIG. 1. The first substrate 110F may include a support plate 112A, a driving layer 114A, an underlying layer 116D and an alignment layer 118A. In the embodiment, the first substrate 110F may have microstructures MS5 including the protrusions PP5 and the concaves CV5 between the protrusions PP5, and each of the protrusions PP5 may include a first portion PP5A and a second portion PP5B. The first portion PP5A may have a material and a thickness the same as the alignment layer 118A, but it is not limited thereto. The depth of the concaves CV5 is greater than the thickness of the first portion PP5A and may be ranged from 1 nm to 100 μm. The underlying layer 116D may be patterned so that the underlying layer 116D at the concaves CV5 may have a smaller thickness than the underlying layer 116D at the protrusions PP5. The thicker portion of the underlying layer 116D defines the second portion PP5B of each protrusion PP5. The thinner portion of the underlying layer 116D defines a portion of each concave CV5.

The microstructures MS5 may distribute between the perimeter P118A of the alignment layer 118A and the edge E112A of the support plate 112A. A portion of the microstructures MS5 overlap the sealant SL and another portions of the microstructures MS5 are located between the outer edge ESL of the sealant SL and the edge of the support plate 112A without overlapping the sealant SL.

Figure 9:
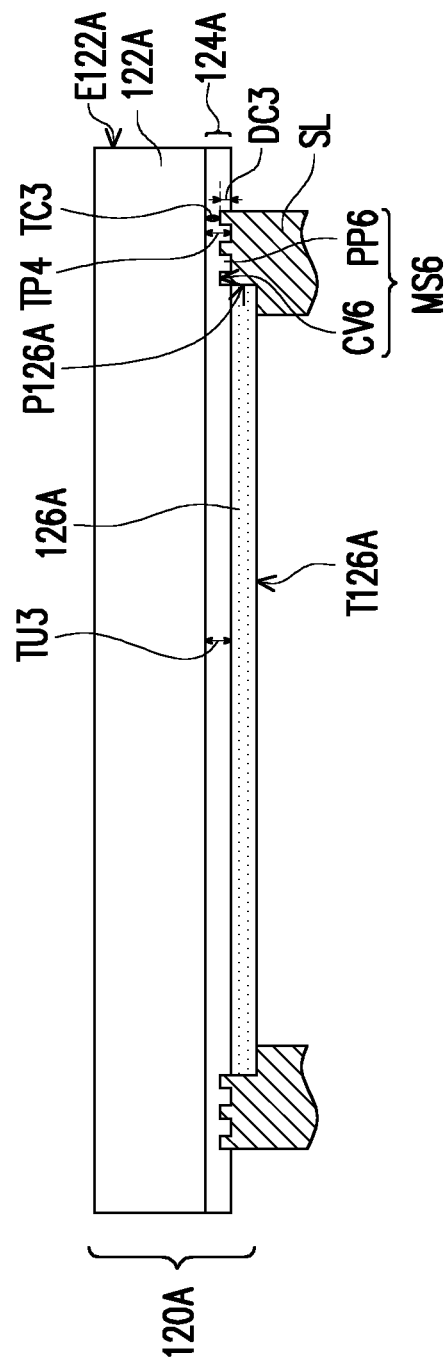
FIG. 9 to FIG. 15 schematically illustrates a cross section of a portion B-B of a display panel according to some embodiments of the disclosure.

FIG. 9 schematically illustrates a cross section of a portion B-B of a display panel according to some embodiments of the disclosure and FIG. 9 only shows the second substrate and the sealant of the display panel for simplifying the drawing. In FIG. 9, the second substrate 120A may be applicable in the display panel DP to serve as an exemplary example for accomplishing the second substrate SUB2 in FIG. 1. In FIG. 9, the second substrate 120A may include a support plate 122A, an underlying layer 124A and an alignment layer 126A. The support plate 122A may include a glass substrate, a polymer substrate, or the like. The underlying layer 124A and the alignment layer 126A are sequentially disposed on the support plate 122A and an entirety of the alignment layer 126A is disposed on the underlying layer 124A. The underlying layer 124A may be a layer disposed between the support plate 122A and the alignment layer 126A and in contact with the alignment layer 126A. Based on the formation sequence, the underlying layer 124A is formed prior to the alignment layer 126A and thus is considered as underlying the alignment layer 126A. The underlying layer 124A may be a conductive layer for providing the electric field for driving the display medium layer DM shown in FIG. 1. In some embodiments, the second substrate 120A may further include a color filter layer (not shown) disposed on the support plate 122A between the support plate 122A and the underlying layer 124A.

The alignment layer 126A may be disposed on the support plate 122A facing the display medium layer DM and the alignment layer 126A may be in contact with the display medium layer DM shown in FIG. 1. In some embodiments, the material of the alignment layer 126A may include polymer such as polyimide or the like. The top surface T126A of the alignment layer 126A in contact with the display medium layer DM may have alignment structures by rubbing so as to align the orientation of the molecules of the display medium layer DM.

The second substrate 120A may have the microstructures MS6 including protrusions PP6 and concaves CV6 between the protrusions PP6. The protrusions PP6 and the concaves CV6 may be formed in the underlying layer 124A. The protrusions PP6 and the concaves CV6 are positioned between the perimeter P126A of the alignment layer 126A and the edge E122A of the support plate 122A. The concaves CV6 and the protrusions PP6 may be alternately arranged. In some embodiments, the arrangement, the shape and the area of the concaves CV6 and the protrusions PP6 in top view may be similar to those of the microstructures MS depicted in FIG. 2.

The underlying layer 124A may have a thickness TP4 at the protrusions PP6 and a thickness TC3 at the concaves CV6, and the thickness TP4 may be greater than the thickness TC3. The concaves CV6 may have a depth DC3 and the sum of the depth DC3 and the thickness TC3 may be substantially equal to the thickness TP4, but not limited thereto. The underlying layer 124A may have a thickness TU3 at the portion in contact with and cover by the alignment layer 126A. In some embodiments, the thickness TP4 may be similar to or identical to the thickness TU3 and the thickness TC3 may be smaller than the thickness TU3, but not limited thereto. The concaves CV6 may not be covered by the material of the alignment layer 126A and may be in contact with the sealant SL.

The formation method of the microstructures MS6 may be similar to that of microstructures MS1. For example, the underlying layer 124A may be partially removed during the patterning process for forming the alignment layer 126A with the required perimeter P126A, such that the microstructures MS6 are formed by the patterned underlying layer 124A. The microstructures MS6 may be arranged along the perimeter P126A of the alignment layer 126A. Subsequent to the formation of the alignment layer 126A and the microstructures MS6, the sealant SL may be formed on the second substrate 120A to assemble the second substrate 120A with the first substrate, e.g. the first substrate SUB1 shown in FIG. 1. The perimeter P126A of the alignment layer 126A may be completely covered and encapsulated by the sealant SL. The material of the alignment layer 126A may have a water vapor transmittance greater than the material of the sealant SL, such that external vapor transmitting to the display medium layer DM (shown in FIG. 1) through the alignment layer 126A would be reduced.

In addition, the sealant SL may exceed the alignment layer 126A and be in contact with a portion of the protrusions PP6 and a portion of the concaves CV6, such that the contact surface of the sealant SL contacting the second substrate 120A may be increased to enhance the connection strength between the sealant SL and the underlying layer 124A and prevent the peeling of the sealant SL from the underlying layer 124A.

Figure 10:
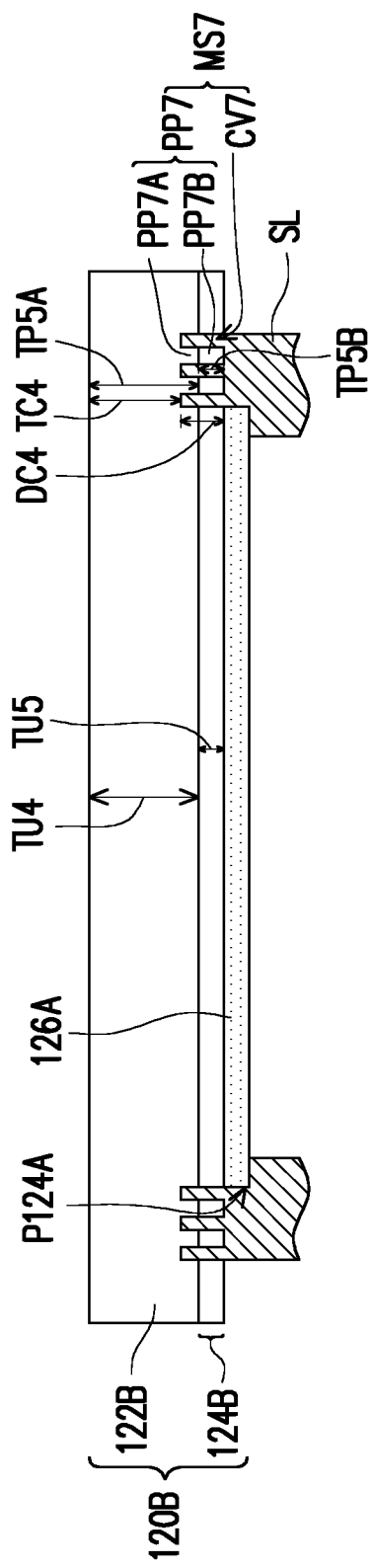

FIG. 10 schematically illustrates a cross section of a portion B-B of a display panel according to some embodiments of the disclosure. In FIG. 10, the second substrate 120B may be applicable in the display panel DP to serve as another exemplary example for accomplishing the second substrate SUB2 in FIG. 1. The second substrate 120B may include a support plate 122B, an underlying layer 124B, and an alignment layer 126A. The alignment layer 126A may be similar to that described in the above embodiments and the details for the alignment layer 126A are not reiterated here.

The second substrate 120B may have the microstructures MS7 including protrusions PP7 and concaves CV7. In the embodiment, the material of the underlying layer 124B may be removed at the concaves CV7 and the material of the support plate 122B may be also partially removed at the concaves CV7. Each of the protrusions PP7 of the microstructures MS7 may include a first portion PP7A formed in the support plate 122B and a second portion PP7B formed in the underlying layer 124B. The underlying layer 124B is not divided by the concaves CV7 and thus is continuous between the microstructures MS7. In some embodiments, the underlying layer 124B is a conductive layer and the second portions PP7B formed in the underlying layer 124B is electrically in direct connected to the portion of the underlying layer 124B in contact with and covered by the alignment layer 126A.

The support plate 122B may have a thickness TPSA at the protrusions PP7 and a thickness TC4 at the concaves CV7, and the thickness TPSA is greater than the thickness TC4 so as to define the first portion PP7A of the protrusion PP7. In some embodiments, the support plate 122B may have a thickness TU4 at the portion overlapping the alignment layer 126A. The thickness TU4 may be substantially the same as the thickness TPSA and greater than the thickness TC4. The alignment layer 124B may be absent at the concaves CV7. The alignment layer 124B may have a thickness TPSB at the protrusions PP7 to define the second portion PP7B of the protrusion PP7 and a thickness TU5 at the portion in contact with the alignment layer 126A. In some embodiments, the thickness TPSB may be substantially the same as the thickness TU5. In some embodiments, the concaves CV7 may penetrate through the underlying layer 124B and extend in the support plate 122B. The depth DC4 of the concaves CV7 may be greater than the thickness TP5B of the underlying layer 124B at the protrusions PP7. In some embodiments, the depth DC4 of the concaves CV7 may range from 1 nm to 100 μm, but not limited thereto. However, the disclosure is not limited to the structure shown in FIG. 10. In some alternative embodiments, the support plate 122B may not be thinned at the concaves CV7, such that the depth of the concaves may be reduced compared to the concaves CV7 shown in FIG. 10.

The sealant SL is disposed on the second substrate 120B and in contact with the protrusions PP7 and also the portions of the support plate 122B and the underlying layer 124B defining the concaves CV7. The contact surface of the sealant SL contacting the second substrate 120B may be increased so as to prevent the peeling of the sealant SL from the second substrate 120B. In addition, the sealant SL covers and seals the perimeter P124A of the alignment layer 124A so that water vapor transmitting to the display medium layer (e.g. the display medium layer DM shown in FIG. 1) through the alignment layer 124A may be mitigated and/or prevented, which improves the life time and the reliability of the display panel including the second substrate 120B.

Figure 11:
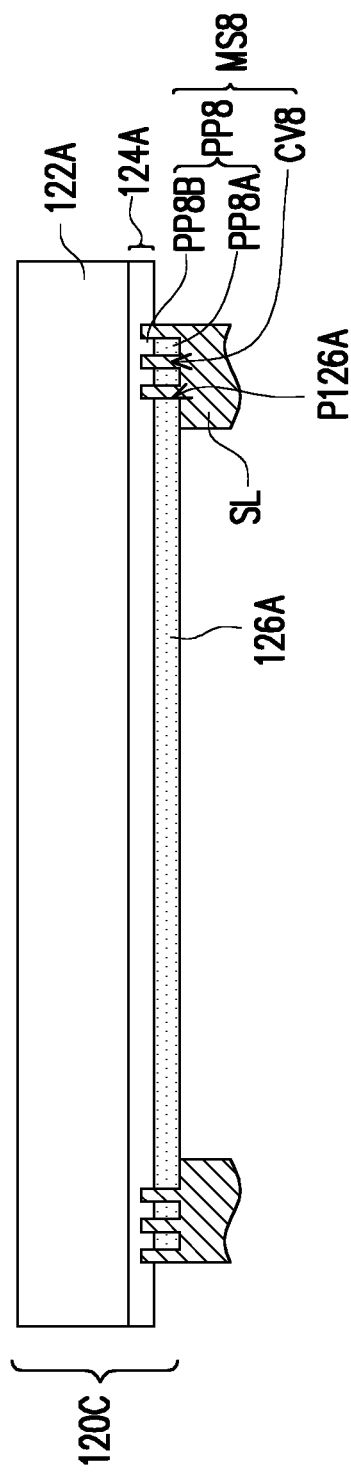

FIG. 11 schematically illustrates a second substrate and a sealant in a display panel according to some embodiments. In FIG. 11, the second substrate 120C may be applicable in the display panel DP to serve as an exemplary example for accomplishing the second substrate SUB2 in FIG. 1. The second substrate 120C may include a support plate 122A, an underlying layer 124A and an alignment layer 126A. The support plate 122A, the underlying layer 124A and the alignment layer 126A may be similar to those described in the above embodiments and the details for these components are not reiterated here. The second substrate 120C may have the microstructures MS8 including protrusions PP8 and concaves CV8 between the protrusions PP8, and each of the protrusions PP8 may include a first portion PP8A and a second portion PP8B. The first portion PP8A may have a material and a thickness the same as the alignment layer 126A, but is not limited thereto. The depth of the concaves CV8 is greater than the thickness of the first portion PP8A and may be ranged from 1 nm to 100 μm. The first portion PP8A is separated from the alignment layer 126A by at least one concave CV8. In other words, the alignment layer 126A and the first portion PP8A are not in contact with each other. The underlying layer 124A may be patterned so that the underlying layer 124A at the concaves CV8 may have a smaller thickness than the underlying layer 124A at the protrusions PP8. The thicker portion of the underlying layer 124A defines the second portion PP8B of respective protrusions PP8. The thinner portion of the underlying layer 124A defines a portion of each concave CV8. The first portion PP8A is disposed on top of the second portion PP8B to define the protrusion PP8. In some embodiments, the dual layer design of the protrusions PP8 may be applicable in the embodiment of FIG. 10, such that the material of the alignment layer 126A may remain on the top of the underlying layer 124B at the protrusions PP7.

The sealant SL may contact the microstructures MS8 with a staggered interface therebetween so as to increase the contacting surface area and ensure the connection between the sealant SL and the second substrate 120C. In addition, the perimeter P126A of the alignment layer 126A is sealed and covered by the sealant SL, which prevents from the water vapor transmission through the alignment layer 126A and thus is able to ensure the lifetime of the display medium layer (e.g. DM in FIG. 1) encapsulated by the sealant SL.

Figure 12:
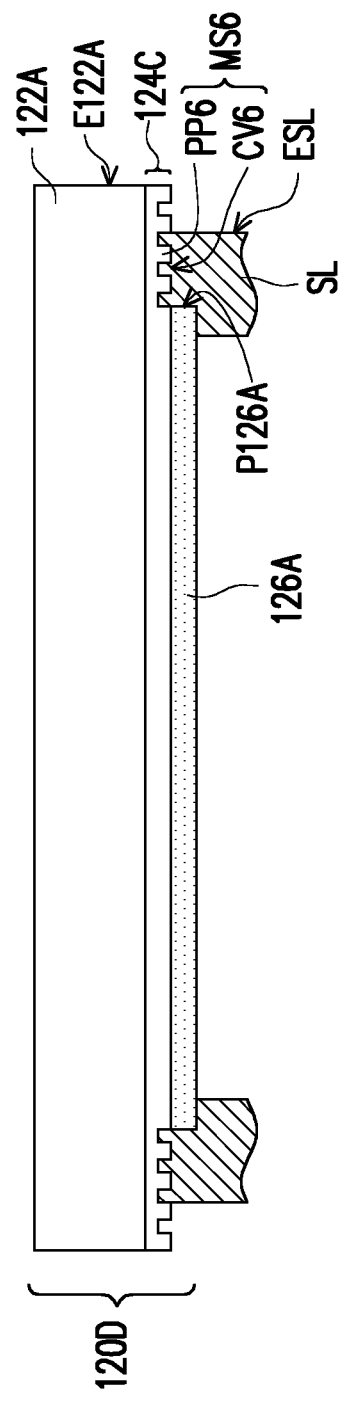

FIG. 12 schematically illustrates a first substrate in a display panel according to some embodiments. In FIG. 12, the second substrate 120D may be applicable in the display panel DP to serve as a further exemplary example for accomplishing the second substrate SUB2 in FIG. 1. The second substrate 120D may include a support plate 122A, an underlying layer 124C and an alignment layer 126A. The underlying layer 124C, similar to the underlying layer 124A in FIG. 9, may have protrusions PP6 and concaves CV6 between the protrusions PP6. The protrusions PP6 and the concaves CV6 define the microstructures MS6 in the second substrate 120D. In the embodiment, the microstructures MS6 may distribute in the region between the perimeter P126A of the alignment layer 126A and the edge E122A of the support plate 122A. In addition, the sealant SL may overlap a portion of the microstructures MS6 and another portion of the microstructures MS6 is positioned between the outer edge ESL of the sealant SL and the edge E122A of the support plate 122A without being covered by the sealant SL.

Figure 13:
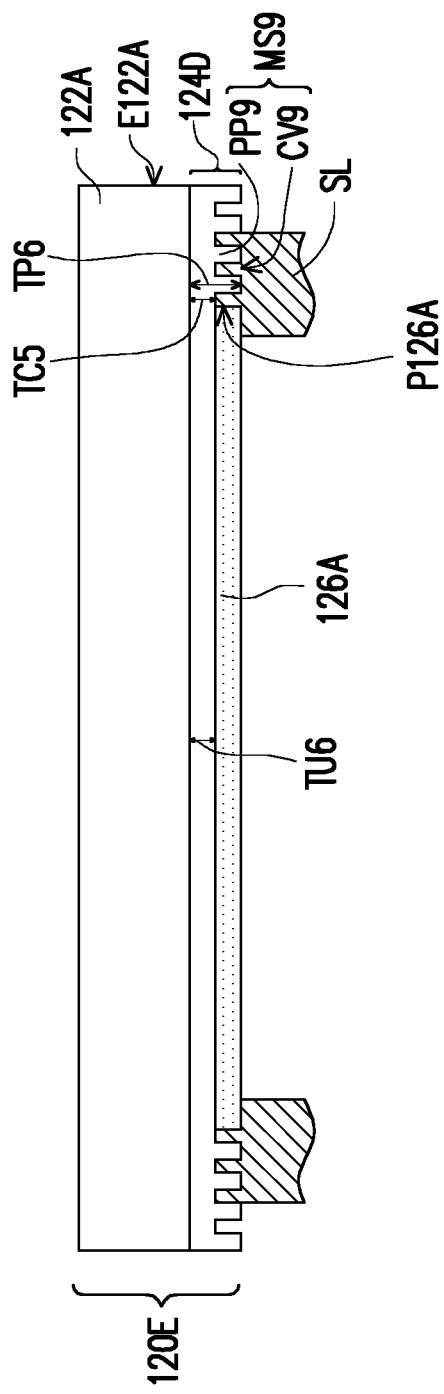

FIG. 13 schematically illustrates a second substrate in a display panel according to some embodiments. In FIG. 13, the second substrate 120E may be applicable in the display panel DP to serve as a further exemplary example for accomplishing the second substrate SUB2 in FIG. 1. The second substrate 120E may include a support plate 122A, an underlying layer 124D and an alignment layer 126A. The underlying layer 124D may have protrusions PP9 and concaves CV9 between the protrusions PP9 to define the microstructures MS9 in the second substrate 120E. The thickness TP6 of the underlying layer 124D at the protrusions PP9 may be greater than the thickness TC5 of the underlying layer 124D at the concaves CV9. In addition, thickness TU6 of the underlying layer 124D at the portion of the underlying layer 124D covered by the alignment layer 126A may be similar to or the same as the thickness TC5 of the underlying layer 124D at the concaves CV9. The thickness TP6 of the underlying layer 124D at the protrusions PP9 may be greater than the thickness TU6 of the underlying layer 124D at the portion of the underlying layer 124D covered by the alignment layer 126A. In the embodiment, the microstructures MS9 may distribute in the region between the perimeter P126A of the alignment layer 126A and the edge E122A of the support plate 122A. In addition, the sealant SL may overlap a portion of the microstructures MS9 and another portion of the microstructures MS9 is positioned between the sealant SL and the edge E122A of the support plate 122A without being covered by the sealant SL.

Figure 14:
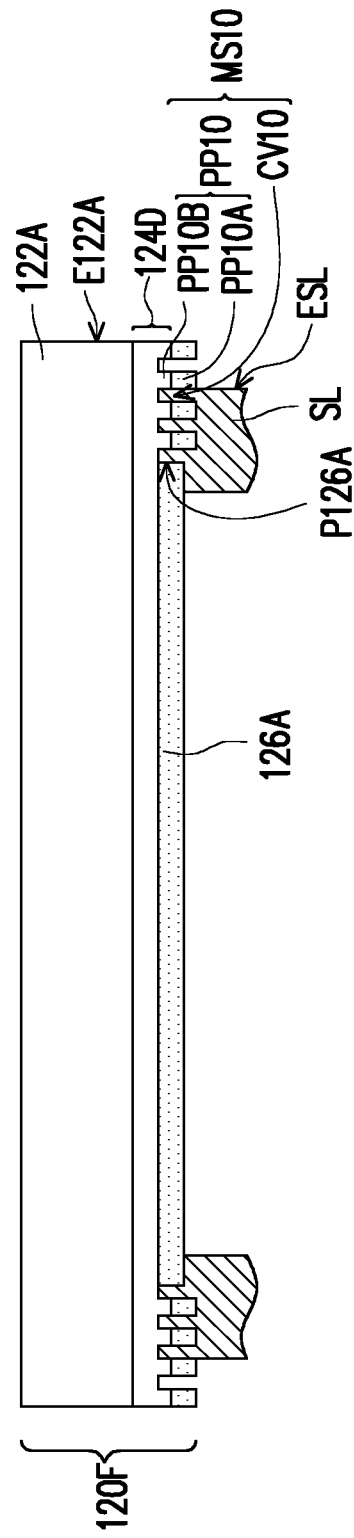

FIG. 14 schematically illustrates a second substrate in a display panel according to some embodiments. In FIG. 14, the second substrate 120F may be applicable in the display panel DP to serve as a further exemplary example for accomplishing the second substrate SUB2 in FIG. 1. The second substrate 120F is substantially similar to the second substrate 120E described in the above embodiments and includes the support plate 122A, the underlying layer 124D and the alignment layer 126A. In addition, the second substrate 120F is different from the second substrate 120E in that the second substrate 120F have the microstructures MS10 including the protrusions PP10 having a dual layer design and the concaves CV10 between the protrusions PP10. Each of the protrusions PP10 includes a first portion PP10A made of the material of the alignment layer 126A and a second portion PP10B made of the material of the underlying layer 124D. The first portion PP10A is disposed on top of the second portion PP10B. In the embodiment, the underlying layer 124D at the portion overlapping the alignment layer 126A may have a thickness smaller than that at the protrusion PP10. The microstructures MS10 may distribute in the region between the perimeter P126A of the alignment layer 126A and the edge E122A of the support plate 122A. In addition, the sealant SL may overlap a portion of the microstructures MS10 and another portion of the microstructures MS10 is positioned between the outer edge ESL of the sealant SL and the edge E122A of the support plate 122A without being covered by the sealant SL.

Figure 15:
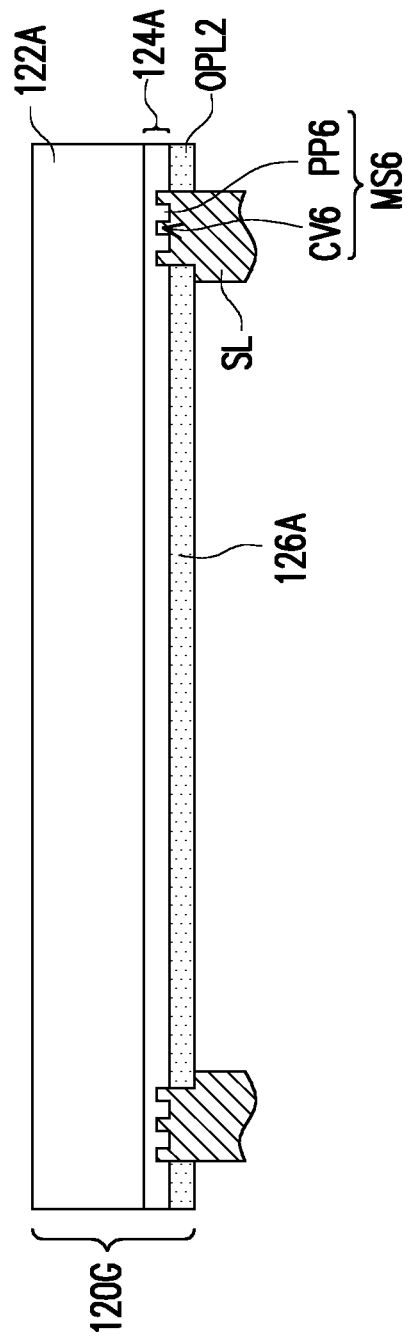

FIG. 15 schematically illustrates a second substrate in a display panel according to some embodiments. In FIG. 15, the second substrate 120G may be applicable in the display panel DP to serve as another exemplary example for accomplishing the second substrate SUB2 in FIG. 1. The second substrate 120G may include a support plate 122A, an underlying layer 124A and an alignment layer 126A. The support plate 122A, the underlying layer 124A and the alignment layer 126A may be similar to those described in the above embodiments and the details for these components are not reiterated here. The second substrate 120G may have the microstructures MS6 formed by the protrusions PP6 and the concaves CV6 in the underlying layer 124A. The second substrate 120G may further include an outer periphery layer OPL2 disposed on the support plate 122A. A portion of the underlying layer 124A is disposed between the support plate 122A and the outer periphery layer OPL2. The microstructures MS6 are located between the alignment layer 124A and the outer periphery layer OPL2 and the sealant SL is in contact with the microstructures MS6. The outer periphery layer OPL2 may be in contact with the underlying layer 124A and made of a material identical to a material of the alignment layer 126A. In some embodiments, the outer periphery layer OPL2 may be applicable in the embodiment of FIG. 10 and formed between the microstructures MS7 and the edge of the support plate 122A without in contact with the alignment layer 126A shown in FIG. 10.

The first substrates 110A to 110F and the second substrates 120A to 120G may be applicable in the display panel DP shown in FIG. 1. In some embodiments, one of the first substrate 110A to 110F may be used as the first substrate SUB1 of the display panel DP while the second substrate SUB2 does not adopt the structure of any of the second substrates 120A to 120G. Alternatively, one of the second substrate 120A to 120G may be used as the second substrate SUB2 of the display panel DP while the first substrate SUB1 does not adopt the structure of any of the first substrates 110A to 110F. In still another embodiment, the first substrate SUB1 of the display panel DP may adopt the structure of one of the first substrates 110A to 110F while the second substrate SUB2 of the display panel DP adopt the structure of one of the second substrate 120A to 120G. The microstructures MS1 to MS10 described in the above embodiments may have an arrangement similar to the microstructures MS shown in FIG. 2, e.g. the microstructures may be arranged along the perimeter of the alignment layer. In addition, the sealant SL may cover and completely sealed the perimeter of the alignment layer, and the sealant SL is in contact with at least a portion of the microstructures MS1 to MS10.

In summary, the display panel in accordance with some embodiments of the disclosure may include at least one substrate having the alignment layer the perimeter of which is completely sealed by the sealant. The water vapor transmission into the display medium layer through the alignment layer may be reduced or prevented. In addition, the substrate of the display panel further has microstructures and the sealant is in contact with the microstructures. The interface between the sealant and the microstructures is staggered so that the contacting surface area between the sealant and the microstructures may be increased to prevent the peeling of the sealant from the first substrate or the second substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall in the scope of the following claims and their equivalents.

What is claimed is:
1. A display panel, comprising:
  a first substrate;
  a second substrate;
  a display medium layer disposed between the top substrate and the bottom substrate; and
  a sealant disposed between the first substrate and the second substrate and surrounding the display medium layer,
  wherein at least one of the first substrate and the second substrate comprises:
    a support plate;
    an alignment layer disposed on the support plate between the support plate and the display medium layer, a perimeter of the alignment layer being completely encapsulated by the sealant; and
  an underlying layer disposed between the support plate and the alignment layer and the alignment layer being constantly in direct contact with and over the underlying layer;
  wherein the at least one of the first substrate and the second substrate has a plurality of microstructures positioned between the perimeter of the alignment layer and an edge of the support plate;

the microstructures comprise protrusions and concaves between the protrusions, and the concaves are not covered by a material of the alignment layer;

the underlying layer comprises thicker portions forming the protrusions and thinner portions forming the concaves and interposed between the thicker portions; and at all of the concaves overlapped with the sealant, the sealant is in direct contact with the underlying layer having a different material from the alignment layer.

2. The display panel according to claim 1, wherein the sealant is in contact with at least a portion of the microstructures.

3. The display panel according to claim 1, wherein the sealant is in contact with a portion of a top surface of the alignment layer.

4. The display panel according to claim 1, wherein the microstructures are arranged along the perimeter of the alignment layer.

5. The display panel according to claim 1, wherein the concaves penetrate through the underlying layer.

6. The display panel according to claim 1, wherein each of the protrusions comprises a first portion and a second portion, and the first portion is disposed on top of the second portion.

7. The display panel according to claim 6, wherein a material of the first portion is identical to the alignment layer or the underlying layer, and a material of the second portion is identical to the underlying layer or the support plate.

8. The display panel according to claim 1, wherein a thickness of a portion of the underlying layer covered by the alignment layer is substantially the same as a thickness of the underlying layer at the protrusions.

9. The display panel according to claim 1, wherein a thickness of a portion of the underlying layer covered by the alignment layer is smaller than the thickness of the underlying layer at the protrusions.

10. The display panel according to claim 1, wherein the underlying layer is a conductive layer.

11. The display panel according to claim 1, wherein the underlying layer is continuous between the microstructures.

12. The display panel according to claim 1, wherein the underlying layer is an insulation layer.

13. The display panel according to claim 12, wherein the at least one of the first substrate and the second substrate further comprises a driving layer disposed on the support plate between the underlying layer and the support plate.

14. The display panel according to claim 12, wherein the support plate is a wafer plate.

15. The display panel according to claim 1, wherein an entirety of the alignment layer is disposed on the underlying layer.

16. The display panel according to claim 1, wherein the at least one of the first substrate and the second substrate further comprises an outer periphery layer disposed on the support plate, the underlying layer is disposed between the support plate and the outer periphery layer, and the microstructures are located between the perimeter of the alignment layer and the outer periphery layer.

17. The display panel according to claim 16, wherein a material of the outer periphery layer is identical to a material of the alignment layer.

* * * * *